(12) United States Patent
Jeong et al.

(10) Patent No.: US 6,891,754 B2
(45) Date of Patent: May 10, 2005

(54) NONVOLATILE SEMICONDUCTOR MEMORY WITH A PROGRAMMING OPERATION AND THE METHOD THEREOF

(75) Inventors: Jae-Yong Jeong, Kyunggi-do (KR); Sung-Soo Lee, Kyunggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/927,716

(22) Filed: Aug. 27, 2004

(65) Prior Publication Data

US 2005/0030790 A1 Feb. 10, 2005

Related U.S. Application Data

(62) Division of application No. 10/659,634, filed on Sep. 9, 2003, now Pat. No. 6,807,098, which is a continuation of application No. 10/021,639, filed on Dec. 12, 2001, now Pat. No. 6,650,566.

(30) Foreign Application Priority Data

Dec. 12, 2000 (KR) .................................. 2000-75641
Dec. 12, 2000 (KR) .................................. 2000-75642

(51) Int. Cl.$^7$ ........................... G11C 16/04; G11C 7/00
(52) U.S. Cl. ........................ 365/185.12; 365/189.12
(58) Field of Search ..................... 365/185.12, 185.17, 365/185.11, 189.12

(56) References Cited

U.S. PATENT DOCUMENTS

| | | |
|---|---|---|
| 5,677,873 A | 10/1997 | Choi et al. |
| 5,768,188 A | 6/1998 | Park et al. |
| 5,768,215 A | 6/1998 | Kwon et al. |
| 5,862,074 A * | 1/1999 | Park ...................... 365/185.03 |
| 5,966,326 A * | 10/1999 | Park et al. ............. 365/185.11 |
| 5,982,663 A | 11/1999 | Park |
| 5,991,202 A | 11/1999 | Derhacobian et al. |
| 6,282,121 B1 | 8/2001 | Cho et al. |
| 6,285,587 B1 | 9/2001 | Kwon |
| 6,288,936 B1 | 9/2001 | Kawamura |
| 6,353,555 B1 | 3/2002 | Jeong |

* cited by examiner

Primary Examiner—Thong Q. Le
(74) Attorney, Agent, or Firm—Marger Johnson & McCollom, P.C.

(57) ABSTRACT

The invention provides a method of programming in a nonvolatile semiconductor memory device, having a plurality of memory cell strings connected to a plurality of bitlines and constructed of a plurality of memory cell transistors whose gates are coupled to a plurality of wordlines, and a plurality of registers corresponding to the bitlines. The method involves applying a first voltage to a first one of the bitlines and applying a second voltage to a second one of the bitline, the first bitline being adjacent to the second bitline, the first and second voltages being supplied from the registers; electrically isolating the first and second bitlines from their corresponding registers; charging the first bitline up to a third voltage higher than the first voltage and lower than the second voltage; and applying a fourth voltage to a wordline after cutting off current paths into the first and second bitlines.

17 Claims, 7 Drawing Sheets

NONVOLATILE SEMICONDUCTOR MEMORY WITH A PROGRAMMING OPERATION AND THE METHOD THEREOF

This application is a divisional of U.S. patent application Ser. No. 10/659,634, filed Sep. 9, 2003, now U.S. Pat. No. 6,807,098, which is a continuation of U.S. patent application Ser. No. 10/021,639, filed Dec. 12, 2001, now issued, Patent No. 6,650,566, both of which are incorporated herein by reference in their entirety.

FIELD OF THE INVENTION

The present invention relates to nonvolatile semiconductor memory devices, and more specifically to a NAND-type flash memory device in which the threshold voltages of parasitic transistors interposed between memory cell transistors belonging to the same rows are controllable for a programming operation.

BACKGROUND OF THE INVENTION

NAND-type flash memory devices are in great demand for their high storage capacity and high integration density, without a need for refreshing, and their straightforward electrical functions of erasing and programming. The facilities of data retention of the NAND flash memory device, even during a power-off, are very useful for portable electronic systems such as mobile computers, digital still cameras, or PDAs.

The NAND flash memory device has memory cells electrically erased and programmed, i.e., EEPROM cells, each being formed of a source and a drain spaced apart from each other in a bulk region (or a semiconductor substrate), a floating gate positioned over a channel region between the source and drain, and a control gate over the floating gate. Insulation films are interposed between the control and floating gates, and between the floating gate and the channel region.

FIG. 1 shows an arrangement of a memory cell array including the EEPROM cells. Memory cell transistors M15~MC0 connected in series form a cell string CS0 (or CS1). The memory cell transistor MC15 is connected to bitline BL0 (or BL1) through string selection transistor SST, and the memory cell transistor MC0 is connected to common source line CSL through ground selection transistor GST. Control gates of the memory cell transistors M15 arranged in a row are coupled to wordline WL15. In the same manner, control gates of other cell transistors in a row are coupled to their corresponding wordlines.

Threshold voltages of the cell transistors are set at about −3V by erasing, and then a programming operation is carried out for a selected memory cell transistor to raise its threshold voltage. This is done by applying a high voltage of 20V to a corresponding wordline coupled to the selected cell transistor. Threshold voltages of the other non-selected cell transistors do not change from their current values. However, typically a programming disturbance occurs whereby memory cell transistors coupled to a wordline coupled to a selected memory cell transistor are undesirably programmed by the high-leveled program voltage even though the cell transistors are not selected in a programming operation.

A program inhibit technique for preventing the non-selected memory cell transistors from being undesirably programmed has been proposed in U.S. Pat. No. 5,677,873 entitled "Method of programming flash EEPROM integrated circuit memory devices to prevent inadvertent programming of nondesignated NAND memory cells therein", or U.S. Pat. No. 5,991,202 entitled "Method for reducing program disturb during self-boosting in a NAND flash memory". In a method of program inhibition called self-boosting, a current path towards a ground is cut off by applying 0V to a gate of the ground selection transistor GST. 0V is applied to a bitline (e.g., BL0) assigned to a selected memory cell transistor while a non-designated bitline (e.g., BL1) sees a program inhibit voltage of 3.3V or 5V of a power supply voltage VCC.

At the same time, the power supply voltage VCC is applied to a gate of the string selection transistor SST so that a source of the string selection transistor is charged up to VCC-Vth (Vth is a threshold voltage of the string selection transistor). The string selection transistor is substantially shut off. Next, a high program voltage Vpgm and a pass voltage Vpass are applied to a selected wordline and non-selected wordlines, respectively, so that channel voltages of the non-selected memory cell transistors are boosted up to levels that prevent programming. The boosted channel voltages prohibit generation of F-N tunneling between the floating gate and channel region, preventing any change of the non-selected memory cell transistors from their primary erased states.

Nevertheless, there is still a problem of programming disturbance, because the non-selected memory cell transistors adjacent to a selected memory cell transistor tend to be programmed due to leakage current flowing through parasitic MOS (meal-oxide-semiconductor) transistors 10 as shown in FIG. 1. The parasitic transistors 10 are connected between active regions (sources or drains) of cell transistors coupled to the same wordlines.

Referring to FIG. 2 which shows a sectional diagram taken along the line A–A' of FIG. 1, channel region 2 of program cell transistor MC14p (to be programmed) and channel region 3 of program-inhibit cell transistor MC14i act as a source and a drain, respectively, of the parasitic transistor. And the wordline W14 acts as a gate of the parasitic transistor. A substrate region under field oxide 14 between the channel regions 2 and 3 is assigned to a channel region of the parasitic transistor. As a result, if the program voltage Vpgm is higher than a threshold voltage of the parasitic transistor, the parasitic transistor will be turned on, inducing a generation of leakage current flowing into the channel region 2 of the program cell transistor MCI 4p from the channel region 3 of the program-inhibit cell transistor MC14i through the conductive parasitic transistor. Thus, the self-boosted voltage at the channel region 2 of the program-inhibit cell transistor MC14i becomes lower, resulting in an undesirable programming disturbance.

There is a way to overcome the aforementioned problem by increasing the threshold voltage of the parasitic MOS transistor, using an ion implantation into the substrate region acting as the channel region of the parasitic transistor. However, it is preferred to restrict such an ion implantation into the substrate region because of a decrease in breakdown voltage in the drain region, or because of a scaling-down of a topological size of the memory cell array. Increasing the threshold voltage of the parasitic transistor by biasing the substrate 1 with a negative voltage is also not desirable because a longer time for charging the substrate 1 increases overall program time.

SUMMARY OF THE INVENTION

Embodiments of the invention provide a nonvolatile semiconductor memory device capable of preventing program disturbance due to parasitic MOS transistors, and a method thereof.

Other embodiments of the invention provide a nonvolatile semiconductor memory device capable of increasing a threshold voltage of a parasitic MOS transistor interposed between adjacent memory cell transistors, without increasing the wordline voltage during a program operation.

Particular example embodiments of a nonvolatile semiconductor memory include: a memory cell array formed of a plurality of memory cell strings each connected to a plurality of bitlines; a plurality of page buffers each connected to the bitlines; a plurality of transistors connected between the bitlines and the page buffers; and a bitline voltage controller applying a bitline control voltage to gates of the transistors. The bitline control voltage is charged to a first voltage during a first bitline setup period and charged to a second voltage during a second bitline setup voltage, the second voltage being lower than the first voltage.

Another aspect of the invention is a method of programming in a nonvolatile semiconductor memory device, which has a plurality of memory cell strings connected to a plurality of bitlines and constructed of a plurality of memory cell transistors whose gates are coupled to a plurality of wordlines, and a plurality of registers corresponding to the bitlines, including the steps of: applying a first voltage to a first one of the bitlines and applying a second voltage to a second one of the bitlines, the first bitline being adjacent to the second bitline, the first and second voltages being supplied from the registers; electrically isolating the first and second bitlines from their corresponding registers; charging the first bitline up to a third voltage higher than the first voltage and lower than the second voltage; and applying a fourth voltage to a wordline after cutting off the current paths into the first and second bitlines.

The first, the second, the third, and the fourth voltages are a ground voltage, a power supply voltage, an inhibit voltage, and a program voltage, respectively.

As the inhibit voltage is applied to the first (i.e., selected) bitline so as to shut off the parasitic transistor interposed between memory cells coupled to the same wordline, the threshold voltage of the parasitic transistor is increased up to a level higher than the program voltage, preventing program disturbance by way of the parasitic transistor.

The present invention will be better understood from the following detailed description of the exemplary embodiment thereof taken in conjunction with the accompanying drawings, and its scope will be pointed out in the appended claims.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings in which like reference symbols indicate the same or similar components, wherein.

DESCRIPTION OF THE PREFERRED EMBODIMENT

It should be understood that the description of this preferred embodiment is merely illustrative and that it should not be taken in a limiting sense. In the following detailed description, several specific details are set forth in order to provide a thorough understanding of the present invention. It will be obvious, however, to one skilled in the art that the present invention may be practiced without these specific details.

Figure 3:
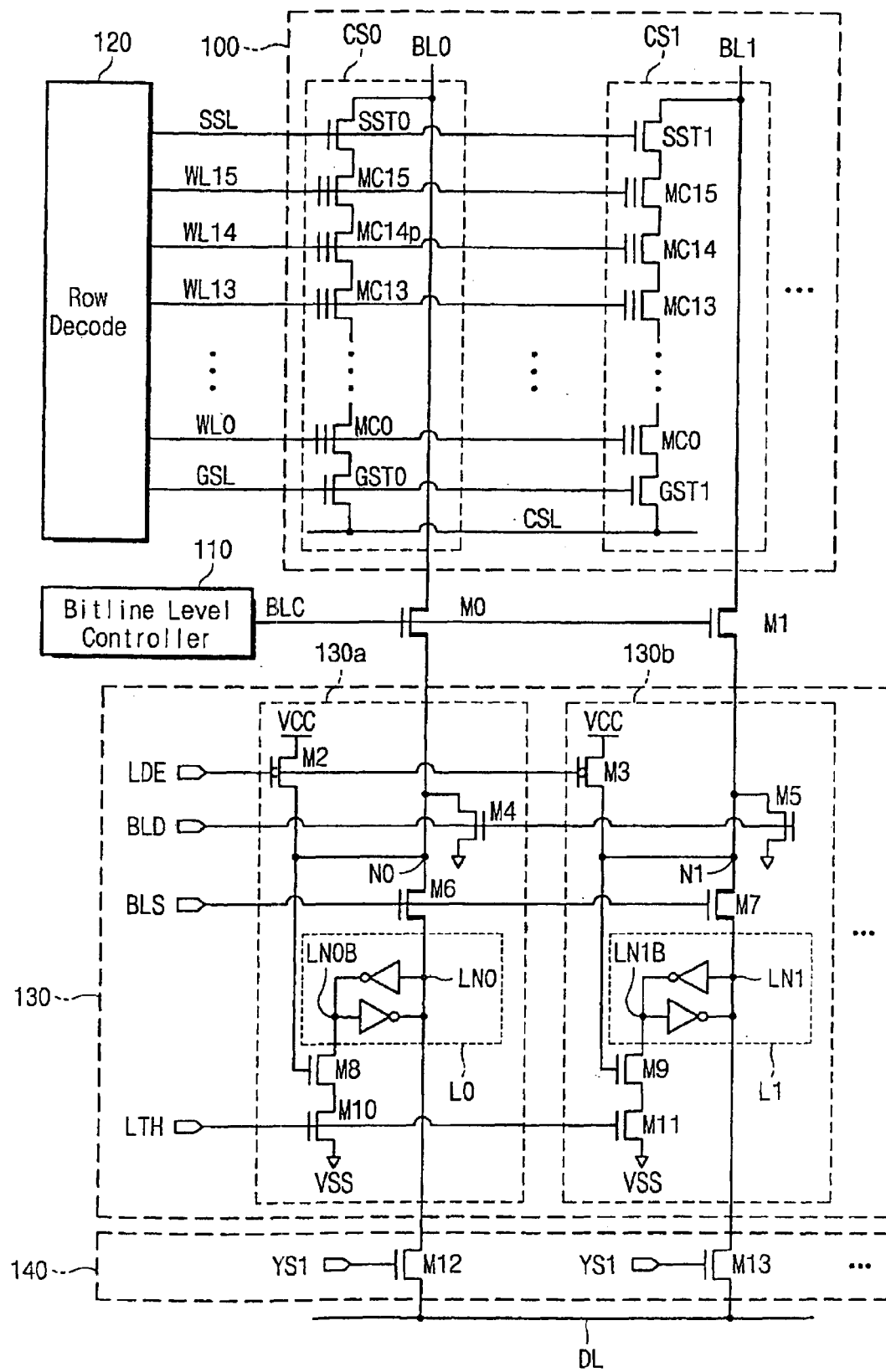
FIG. 3 is a circuit diagram of a memory cell array and a peripheral circuit thereof to perform a programming operation, according to an embodiment of the invention.

Referring first to FIG. 3 showing a circuit construction for performing a program operation according to the first embodiment of the invention, including memory cell array 100, bitline level controller 110, row decoder 120, page buffer (register) circuit 130, and column gate circuit 140. The memory cell array 100 is formed of plural cell strings CS0, CS1, etc. Cell string CS0, for example, is formed of string selection transistor SST0, EEPROM cell transistors MC0~MC15, and ground selection transistor GST0. The string selection transistor SST0 is connected to bitline BL0, and the ground selection transistor GST0 is connected to common source line CSL. The cell transistors MC15~MC0 are connected between the string and ground selection transistors, SST0 and GST0, in serial. String selection line SSL, wordlines WL0~WL15, and ground selection line GSL extend from the row decoder 120, and are coupled to gates of the string selection transistors SST0, SST1, etc., control gates of the cell transistors MC0~MC15, and the gates of the ground selection transistors GST0, GST1, etc., respectively. The bitline BL0 is connected to node N0 of page buffer (register) 130a of the page buffer circuit 130 through high-voltage adaptable NMOS transistor M0, and the bitline BL1 is connected to node N1 of page buffer (register) 130b of the page buffer circuit 130 through high-voltage adaptable NMOS transistor M1. Gates of the transistors M0 and M1 are coupled to a bitline level control signal BLC generated from the bitline level controller 110.

The page buffers (e.g., 130a and 130b) arranged in the page buffer circuit 130 each correspond to the bitlines (e.g., BL0 and BL1). In the page buffer 130a, between VCC and the node N0 is connected PMOS transistor M2 whose gate is coupled to load enable signal LDE. Between N0 and a ground voltage (or a substrate voltage VSS) is connected NMOS transistor M4 whose gate is coupled to bitline discharge signal BLD. The node N0 is connected to latch node LN0 of latch circuit L0 through high-voltage adaptable NMOS transistor M6 whose gate is coupled to bitline selection signal BLS. Between counter nodes LN0, LN0B of the latch circuit L0 and VSS are connected NMOS transistors M8 and M10. Gates of the NMOS transistors M8 and M10 are coupled to the node N0 and latch enable signal LTH, respectively. The latch node LN0 is connected to data line DL through NMOS transistor M12, whose gate is coupled to column selection signal YS0 generated from a column decoder (not shown).

In the page buffer 130b, between VCC and the node N1, is connected a PMOS transistor M3 whose gate is coupled to load enable signal LDE. Between N1 and the ground voltage VSS is connected NMOS transistor M5 whose gate is coupled to bitline discharge signal BLD. The node N1 is connected to latch node LN1 of latch circuit L1 through high-voltage adaptable NMOS transistor M7 whose gate is coupled to bitline selection signal BLS. Between counter nodes LN1, LN1B of the latch circuit L1 and VSS are connected NMOS transistors M9 and M11. Gates of the NMOS transistors M9 and M11 are coupled to the node N1 and latch enable signal LTH, respectively. The latch node LN1 is connected to data line DL through a NMOS transistor M13 whose gate is coupled to column selection signal YS1 generated from a column decoder (not shown).

Figure 4:
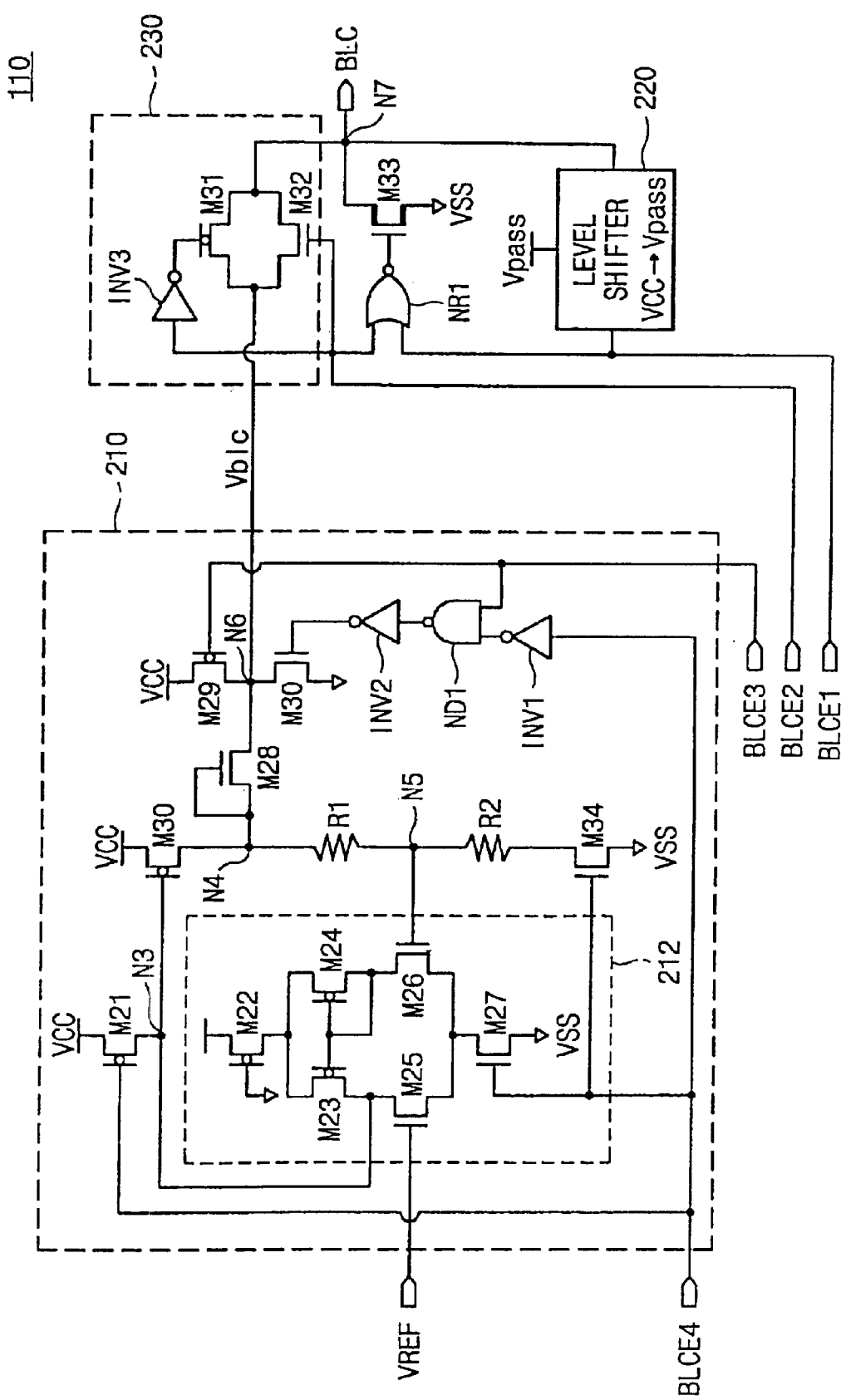
FIG. 4 is a circuit diagram of the bitline level controller shown in FIG. 3.

The bitline level controller 110 in FIG. 4 includes bitline control voltage generator 210, level shifter 220, and CMOS transmission gate 230.

In the bitline control voltage generator 210, reference voltage VREF is applied to the gate of NMOS transistor M25 of differential amplifier 211. Node N5 between resistors R1 and R2 is coupled to the gate of NMOS transistor M26 of the differential amplifier 212. The differential amplifier 212 is constructed of PMOS transistors M22~M24 and of NMOS transistors M25~M27. The PMOS and NMOS transistors, M22 and M27, connect the amplifier 212 to VCC and Vss, respectively. The gate of the PMOS transistor M22 is coupled to VSS while the gate of the NMOS transistor M27 is coupled to bitline control enable signal BLCE4. BLCE4 is also applied to the gate of PMOS transistor M21 connected between VCC and node N3, gate of NMOS transistor M34 connected between the resistor R2 and VSS, and to the input of NAND gate ND1 through inverter INV1. The node N3 is connected to the output of the differential amplifier 212 and to the gate of PMOS transistor M30 which is connected between VCC and node N4 connected to the resistor R1. Node N4 is connected to the node N6 through NMOS transistor M28 whose gate and drain are coupled in common. Between VCC and the node N6 is a PMOS transistor M29 whose gate is coupled to bitline control enable signal BLCE3. BLCE3 is also applied to the input of the NAND gate ND1 together with the output of the inverter INV1. The output of NAND gate ND1 is applied through inverter INV2 to the gate of NMOS transistor M30 connected between the node N6 and VSS.

The output node N6 of the bitline control voltage generator 210, labeled bitline control voltage Vblc, is connected to output terminal N7 generating bitline control signal BLC via a transmission gate 230. An N-channel electrode of the transmission gate 230 is coupled to bitline control enable signal BLCE2, while a P-channel electrode of the transmission gate is coupled to BLCE2 through an inverter INV3. BLCE2 is also applied to an input of NOR gate NR1 together with another bitline control enable signal BLCE1. The output of the NOR gate NR1 is applied to a gate of high-voltage adaptable NMOS transistor M33 connected between the output terminal N7 and VSS. A level shifter 220 converts VCC into program pass voltage Vpass in response to BLCE1.

Figure 5:
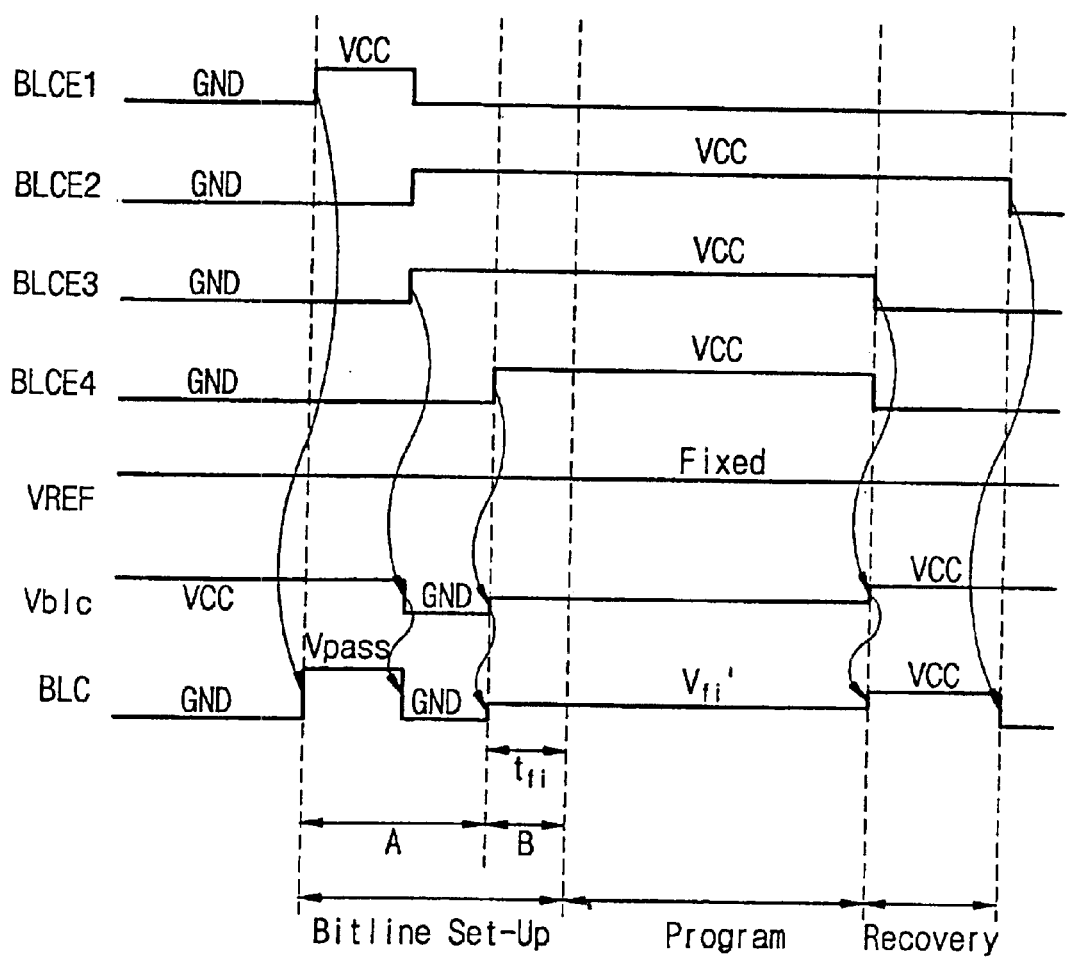
FIG. 5 is a timing diagram illustrating an operation of the bitline level controller of FIG. 4.

FIG. 5 shows voltage waveforms of the signals and voltages in the bitline level controller 110, along a sequence of a program operation. A voltage level of the bitline control signal BLC is set to Vpass in response to BLCEI going high, and then returns to the ground level in response to rising BLCE3, during period A (the first bitline set-up) within a bitline set-up time. During period B (subsequent to A) of the bitline set-up time. BLC goes up to only voltage Vfi' from the ground level before programming, which second bitline set-up voltage Vfi' may be seen from the BLC trace in FIG. 5 to be lower than first bitline set-up up voltage Vpass.

The voltage level Vfi' is a sum of a threshold voltage of a bitline level control transistor (i.e., M0 or M1) and a minimum source-to-bulk voltage that is required for turning the parasitic MOS transistor on. Thus, a level Vfi is provided by the bitline level controller 110 in order to inhibit programming. The inhibit voltage Vfi, higher than the ground voltage, is supplied to a bitline assigned to the program cell. The inhibit voltage Vfi should be established with consideration for a characteristic threshold voltage of a MOS transistor, the threshold voltage of the MOS transistor (i.e., the parasitic MOS transistor) being summarized in the following equation.

$$Vt = Vto + \gamma(\sqrt{2\phi f + Vsb} - \sqrt{2\phi f}) \tag{1}$$

wherein Vto is a threshold voltage when Vsb is 0V, wherein g is a process parameter and of is a physical parameter, as is known.

Because Vt is affected from source-to-bulk voltage Vsb, the inhibit voltage Vfi should be established to shut off a leakage current between adjacent memory cell transistors, i.e., to make the threshold voltage of the parasitic MOS transistor (or a field voltage) be higher than a program wordline voltage, without increasing the wordline voltage during programming. Of course, Vfi is adjusted by the resistance values of the resistors R1 and R2 (See FIG. 4). To bias a bitline of the program cell on Vfi, the voltage level of the bitline level control signal BLC, i.e., Vfi', should be set to Vfi+Vth1 (Vth1: a threshold voltage of the NMOS transistor M0 or M1).

Assume that BL0 is a bitline to be programmed and BL1 is a bitline to be program-inhibited. When all of the bitline control enable signals BLCE1~BLCE4 are held at low levels (e.g., ground levels), the NMOS transistor M33 is turned on and thereby the bitline level control signal BLC is established at the ground level (or VSS). Next, when BLCE1 goes to high level (or VCC) while BLCE2~BLCE4 retain low levels, M33 is turned off and thereby BLC is converted to the pass voltage Vpass by the level shifter 220. The transmission gate 230 is turned off, and Vblc is set to VCC by PMOS transistor M29 turned on by BLCE3. The voltage level of the bitline level control signal BLC, i.e. Vpass, is applied to the gate of the NMOS transistor M0 or M1, so that a data bit "0" to be programmed is supplied to BL0 or BL1 to be programmed through the NMOS transistor M0 or M1. When BLCE1 falls to a low level and BLCE2 and BLCE3 rise up to high levels, the transmission gate 230 and the NMOS transistor M30 are turned on. The output of the level shifter 220 is at ground level. Thus, BLC goes to ground level from Vpass through the discharging path of the transmission gate 230 and the NMOS transistor M30.

After the first bitline set-up period A, the second bitline set-up period B starts with a high transition of BLCE4 while BLCE1 remains low and BLCE2 and BLCE3 maintain high. As the NMOS transistors M27 and M34 are turned on, the differential amplifier 212 is conductive to compare the reference voltage VREF with a voltage at the node N5 divided by the resistors R1 and R2. If a voltage at the node N4 is lower than Vfi'+Vth28 (Vth28 being a threshold voltage of the NMOS transistor M28), i.e., the voltage at N5 is lower than VREF, the voltage at N4 is increased by current supplied through the PMOS transistor M21. When the voltage at N4 reaches Vfi'+Vth28, Vblc becomes Vfi' and thereby BLC is maintained at Vfi' for the programming time. The Vfi' is applied to the gate of the NMOS transistor M1 or M0, so that a data bit "1" for the program inhibition is supplied to BL1 or BL0 to be program-inhibited through the NMOS transistor M1 or M0.

After the programming time, a recovery operation is performed for which BLCE1, BLCE2, BLEC3 and BLCE4 respectively are low, high, low, and low, and Vbls and BLC are set on VCC.

Figure 6:
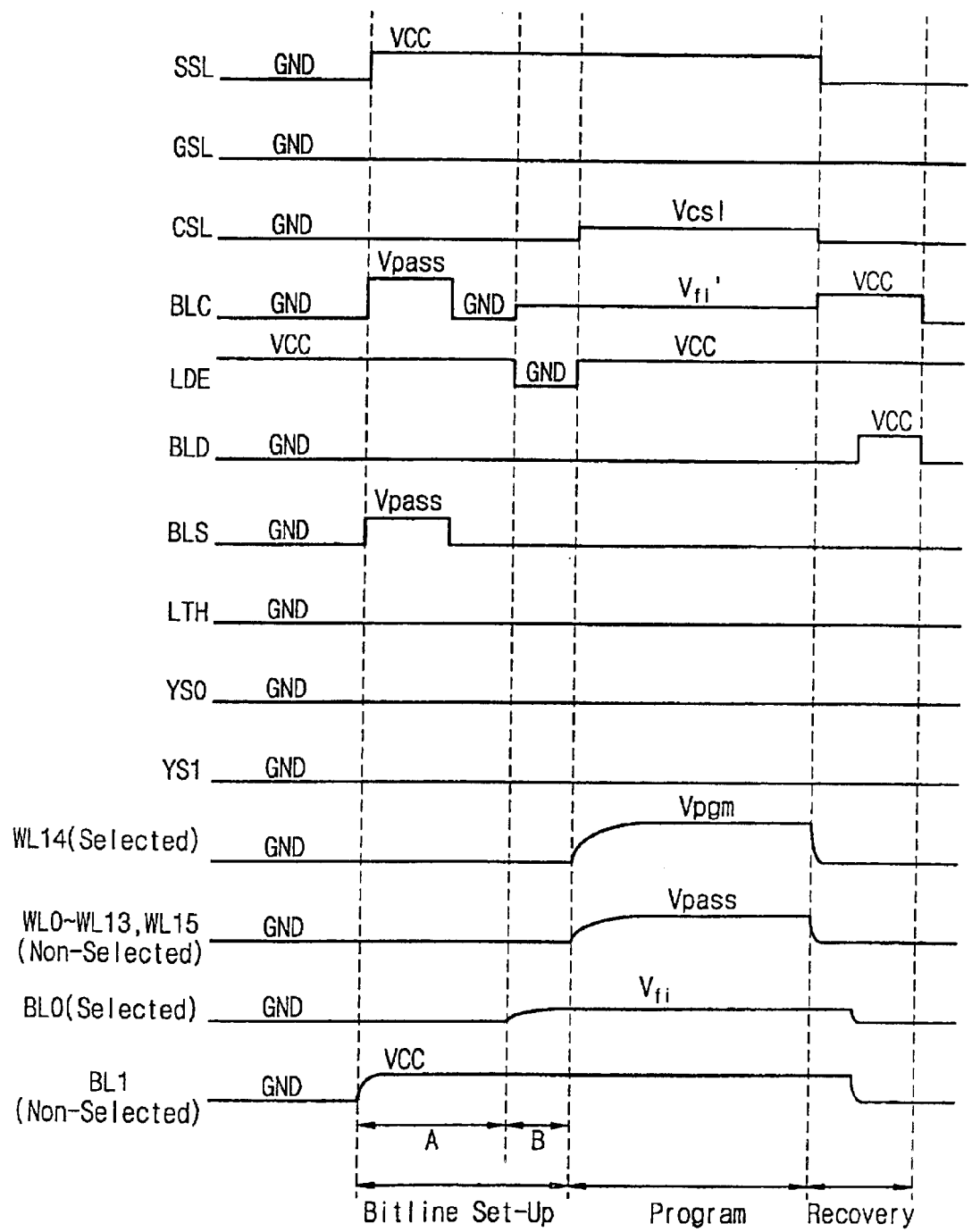
FIG. 6 is a timing diagram illustrating the programming operation performed by the circuit of FIG. 3, according a first embodiment of the invention.

Now, referring to FIG. 6, a programming operation according to the first embodiment of the invention will be described in detail. It is assumed that MC14*p* is a memory cell transistor to be programmed, which means that BL0 is selected while BL1 is non-selected. Thus, the page buffer 130*a* assigned to BL0 holds data bit "0" while the page buffer 130*b* assigned to BL1 stores data bit "1". Also, WL14 coupled to the gate of MCl4*p* is a selected wordline. The timing operation of the bitline level controller 110, shown in FIG. 5, is illustrated in FIG. 6.

At the beginning of the bitline set-up period, SSL goes to high level (hereinafter, referred to as VCC), BLS and BLC go to Vpass, and GSL, CSL, BLD, and LTH are low levels (hereinafter, referred to as GND). The NMOS transistors M0 and M1 are turned on by BLC of Vpass, and the string selection transistors SST0 and SST1 are turned on by SSL of VCC. The NMOS transistor M6 is turned on by BLS of Vpass. As a result, during the first bitline set-up period A, BL0 and BL1 are established GND and VCC, respectively. Before starting the second bitline set-up period B after the bitlines BL0 and BL1 are sufficiently set up each to GND and Vpass, BLC and BLS fall to GND from Vpass, thereby electrically isolating the bitlines BL0 and BL1 from their corresponding page buffers (registers) 130*a* and 130*b*.

Starting the second bitline set-up period B, BLC is charged to Vfi' (=Vfi+Vth1) as aforementioned in FIG. 5. And LDE goes to GND from VCC. Thereby, the current paths through the PMOS transistors M2/M3 and the NMOS transistors M0/M1 are connected to BL0/BL1. Since BLC is at Vfi', the selected bitline BL0 is charged to Vfi while the non-selected bitline BL1 remains at VCC that has been set in the first set-up period A. As the string selection transistors SST0 and SST1 are substantially in a shut-off state (there is no current flow), the cell strings CS0 and CS1 corresponding to BL0 and BL1 are in a floating state.

Consequently, in the programming period, the program voltage Vpgm is applied to the selected wordline WL14, and Vpass is applied to the non-selected wordlines WL0~WL13 and WL15. Since the cell string CSl corresponding to the non-selected bitline BL1 is in the floating state, a channel voltage of the program-inhibit memory cell transistor MC14*i* rises to a level sufficient to prevent a F-N tunneling by way of a self-boosting mechanism induced from Vpgm. The boosted channel voltage of MC14*i* prohibits migration of electrons from its channel region to the floating gate because there is no discharge path due to the VCC-charged BL1. Meanwhile, a channel voltage of the program cell transistor MV14*p* is discharged to Vfi from a boosted level through BL0 even though it raises the boosted level in response to Vpgm that performs the self-boosting. Therefore, the channel voltage of the selected memory cell transistor MC14*p* is finally established at Vfi.

After programming, BL0 and BL1 are discharged to GND, and the page buffers (registers) 130*a* and 130*b* are reset.

Figure 1:
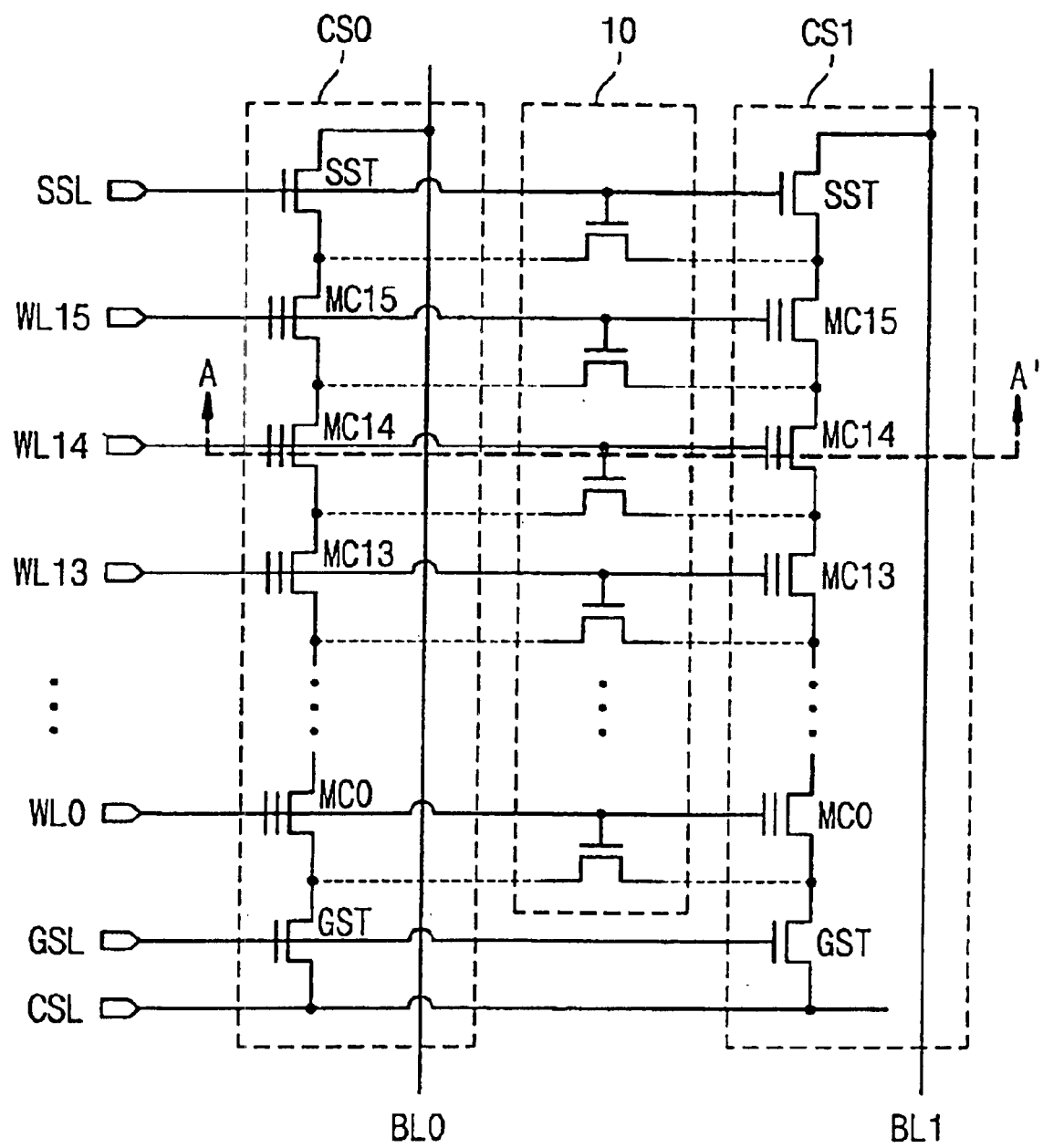
FIG. 1 is a circuit diagram of a general memory cell array in a NAND-type flash memory device.
Figure 2:
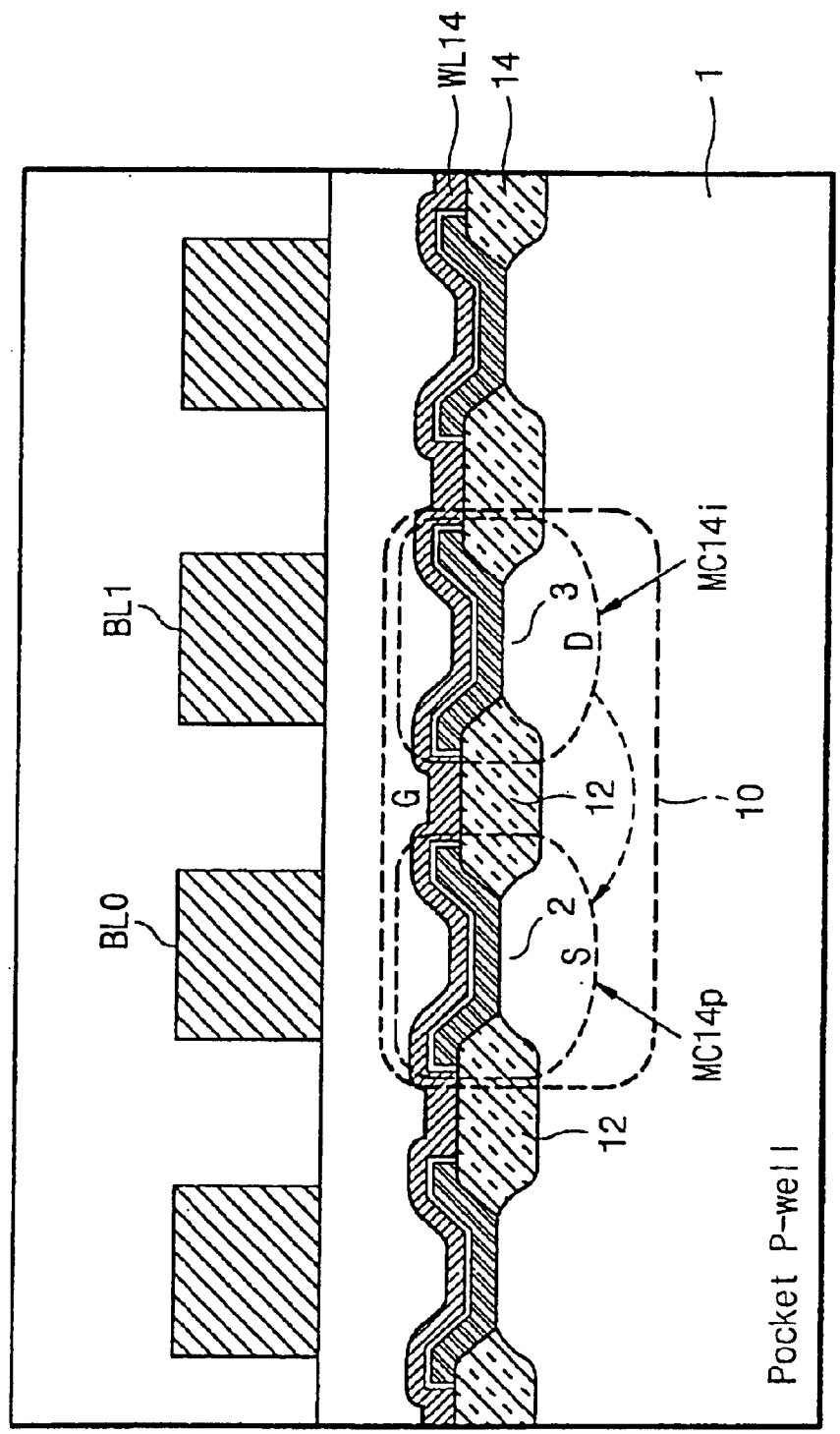
FIG. 2 is a sectional physical diagram of the cell array taken along with the line A–A' of FIG. 1.

At this point, the threshold voltage of the parasitic MOS transistor 10, as shown in equation (1), is established at a level higher than Vpgm, the actual levels being proportional to the source-to-bulk voltage Vsb, which is identical to the channel voltage of the program cell transistor (i.e., MC 14), Vfi. Thus, the parasitic MOS transistor is turned on while Vpgm is applied to WL14, causing the leakage current flowing between MC 14*p* and MC14*i* (See FIG. 2) through the parasitic transistor to be cut off. As a result, the program disturbance due to the parasitic transistor is eliminated.

Figure 7:
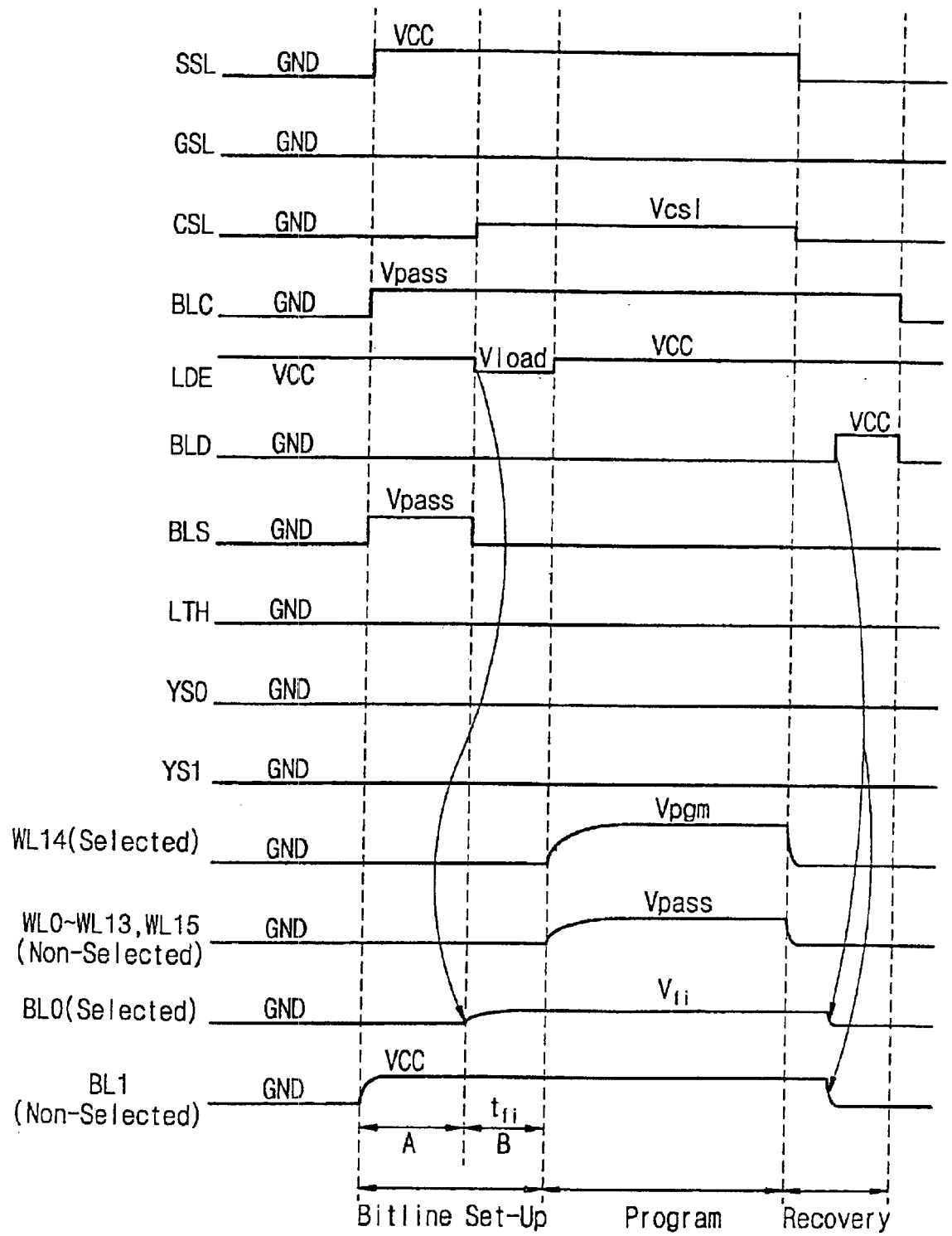
FIG. 7 is a timing diagram illustrating a programming operation performed by the circuit of FIG. 3, according to a second embodiment of the invention.

FIG. 7 shows another case of programming according to the second embodiment of the invention. Like FIG. 6, FIG. 7 assumes that MC14*p* is a memory cell transistor to be programmed, which means that BL0 is selected while BL1 is non-selected. Thus, the page buffer (register) 130*a* assigned to BL0 holds data bit "0" while the page buffer (register) 130*b* assigned to BL1 stores data bit "1". Also, WL 14 coupled to the gates of MC 14*p* and MC 14*i* is a selected wordline. The timing operation of the bitline level controller 110, shown in FIG. 5, is also illustrated in FIG. 6.

At the beginning of the bitline set-up period, SSL goes to VCC, BLS and BLC go to Vpass. At the same time, GSL, CSL, BLD, and LTH maintain GND. The NMOS transistor M0 and M1 are turned on by BLC of Vpass, and the string selection transistors SST0 and SST1 are turned on by SSL of VCC. The NMOS transistor M6 is turned on by BLS of Vpass. As a result, during the first bitline set-up period A, BL0 and BL1 are charged respectively to GND and VCC.

In the second bitline set-up period B, Vcsl is applied to the common source line CSL in order to prevent punch-through in the ground selection transistors GST0 and GST1. And BLS falls to GND from VCC to electrically isolate the bitlines BL0 and BL1 from their corresponding page buffers 130*a* and 130*b*. At the same time, LDE goes to Vload from VCC in order to supply load current Iload to BL0 and BL1 for a predetermined time tfi.

The time for charging the selected bitline BLn up to the inhibit voltage Vfi is associated with load current Iload in the following equation (2):

$$tfi = (CBL \times Vfi)/Iload \quad (2)$$

wherein CBL is capacitance of the bitline.

BLC is charged to Vfi' (=Vfi+Vth1) as aforementioned with respect to FIG. 5. And LDE goes to GND from VCC. Thereby, the current paths through the PMOS transistors M2/M3 and the NMOS transistors M0/M1 are connected to BL0/BL1. Since BLC is at Vfi', the selected bitline BL0 is charged to Vfi while the non-selected bitline BL1 maintains VCC that has been set in the first set-up period A. At this time, as the string selection transistors SST0 and SST1 are substantially in a shut-off state (there is no current flow), the cell strings CS0 and CS1 corresponding to BL0 and BL1 are in a floating state, i.e. current into the first and second bitlines is substantially inhibited.

Consequently, during the programming period, the program voltage Vpgm is applied to the selected wordline WL 14, and Vpass is applied to the non-selected wordlines WL0~WL13, and WL 15. As aforementioned, since the cell string CS1 corresponding to the non-selected bitline BL1 is in the floating state, a channel voltage of the program-inhibit memory cell transistor MC14*i* rises to a level sufficient to prevent a F-N tunneling by way of a self-boosting mechanism induced from Vpgm. The boosted channel voltage of MC14*i* to prohibits migration of electrons from its channel region to the floating gate because there is no discharge path due to the VCC-charged BL1. Meanwhile, a channel voltage of the program cell transistor MV 14*p* is discharged to Vfi from a boosted level through BL0 even though it raises the boosted level in response to Vpgm that performs the self-boosting. Therefore, the channel voltage of the selected memory cell transistor MCl 4*p* is finally established at Vfi.

After programming, BL0 and BL1 are discharged to GND, and the page buffers 130*a* and 130*b* are reset.

At this point, the threshold voltage of the parasitic MOS transistor 10, as shown in the equation (1), is established at a level higher than Vpgm, being proportional to the source-to-bulk voltage Vsb that is identical the channel voltage of the program cell transistor (i.e., MC 14), Vfi. Thus, the parasitic MOS transistor is turned on while Vpgm is applied to WL14, causing the leakage current flowing between MC14p and MC 14i (See FIG. 2) through the parasitic transistor to be cut off. As a result, the program disturbance due to the parasitic transistor is eliminated.

As aforementioned, as the inhibit voltage is applied to the selected bitline in order to turn off the parasitic transistor interposed between memory cells coupled to the same wordline, the threshold voltage of the parasitic transistor is increased up to a level higher than the program voltage and thereby memory devices employing the present invention are able to be free from the program disturbance caused by the parasitic transistor.

Although the preferred embodiments of the present invention have been disclosed for illustrative purposes, those skilled in the art will appreciate that various modifications, additions and substitutions are possible, without departing from the scope and spirit of the invention as described in the accompanying claims.

What is claimed is:

1. A method of programming in a nonvolatile semiconductor memory which has a plurality of memory cell strings connected to a plurality of bid ines and constructed of a plurality of memory cell transistors whose gates are coupled to a plurality of wordlines, and a plurality of registers corresponding to the bitlines, the method comprising the steps of:

applying a first voltage to a first one of the bitlines and a second voltage to a second one of the bitlines during a part of the first bitline setup period, the first bitline being adjacent to the second bitline, the first and second voltages being supplied from the registers;

electrically isolating the first and second bitlines from their corresponding registers during the remaining of the first bitline setup period;

charging the first bitline up to a third voltage higher than the first voltage and lower than the second voltage during a second bitline setup period following the first setup period; and applying a fourth voltage to a wordline after substantially inhibiting current into the first and second bitlines during a program period, wherein the third voltage to the first bitline is maintained during the program period.

2. The method of claim 1, wherein the first, second, third and fourth voltages are a ground voltage, a power supply voltage, an inhibit voltage and a program voltage.

3. The method of claim 1, wherein the nonvolatile semiconductor memory further comprises a plurality of transistors connected between the bitlines and the registers; and a bitline voltage controller configured to apply a bitline control voltage to gates of the transistors.

4. The method of claim 3, wherein the bitline control voltage is charged to a fifth voltage (VPASS) during the part of the first bitline setup period, the first voltage during the remaining of the first bit line setup period, a sixth voltage during the second bitline setup period and a program period following the second bitline setup period, the sixth voltage being lower than the fifth voltage and higher than the first voltage.

5. The method of claim 4, wherein the fifth voltage is a pass voltage.

6. The method of claim 4, wherein the sixth voltage corresponds to the sum of the third voltage and a threshold voltage of an NMOS transistor, the third voltage being a minimum source-bulk voltage needed to turn off a parasitic MOS transistor.

7. The method of claim 4, wherein the bitline control voltage is charged to the second voltage (VCC) during a recovery period following the program period.

8. The method of claim 4, wherein the bitline voltage controller comprises:

a first voltage generator configured to supply the fifth voltage (VPASS) to a voltage line for transferring the bitline control voltage in response to a first bitline control signal (BLCE1);

a second voltage generator configured to generate the first voltage (GND) at an internal node in response to a second and a third bitline control signal (BLCE2, BLCE3);

a third voltage generator configured to generate the sixth voltage (Vfi') at the internal node in response to the fourth bitline control signal (BLCE4); and a switch circuit configured to connect the internal node to the voltage line in response to a second bitline control signal (BLCE2).

9. The method of claim 8, wherein the bitline voltage controller further comprises a discharge circuit configured to discharge a voltage of the voltage line in response to the first and second bitline control signals (BLCE1,BLCE2).

10. The method of claim 8, wherein the bitline voltage controller further comprises a fourth voltage generator configured to generate the second voltage in response to the third bitline control signal.

11. The method of claim 8, wherein the first bitline control signal is activated during the part of the first bitline setup period.

12. The method of claim 8, wherein the second bitline control signal is activated during the remaining of the first bitline setup period, the second bitline setup period, the program period and the recovery period.

13. The method of claim 8, wherein the third control signal is activated during the remaining of the first bitline setup period, the second bitline setup period and the program period.

14. The method of claim 8, wherein the fourth control signal is activated during the second bitline setup period and the program period.

15. The method of claim 8, wherein the first voltage generator includes a level shifter.

16. The method of claim 1, wherein the nonvolatile semiconductor memory further comprises a plurality of load transistors configured to supply current to the bitlines in response to a load control voltage.

17. The method of claim 16, wherein the load control voltage is charged to the second voltage during the first bitline setup period, a fifth voltage (Vload) during the remaining of the second bitline setup period, and the second voltage during a program period following the second bitline setup period, the fifth voltage being higher than the first voltage and lower than the second voltage.

* * * * *

UNITED STATES PATENT AND TRADEMARK OFFICE
CERTIFICATE OF CORRECTION

PATENT NO. : 6,891,754 B2  
APPLICATION NO. : 10/927716  
DATED : May 10, 2005  
INVENTOR(S) : Jeong et al.

Page 1 of 2

It is certified that error appears in the above-identified patent and that said Letters Patent is hereby corrected as shown below:

At column 1, line 41, please replace "M15" with --MC15--

At column 2, line 46, please replace "MCI 4p" with --MC14p--

At column 4, line 39, please replace "to node NO" with --the node N0--

At column 4, line 51, please replace "to node NO" with --to node N0--

At column 4, line 52, please replace "Between NO" with --Between N0--

At column 4, line 55, please replace "The node NO" with --The node N0--

At column 4, line 56, please replace "Latch circuit LO" with --Latch circuit L0--

At column 4, line 59, please replace "Latch circuit LO" with --Latch circuit L0--

At column 4, line 61, please replace "to the node NO" with --to the node N0--

At column 4, line 66, please replace "the node NI" with --the node N1--

At column 5, line 1, please replace "Between NI" with --between N1--

At column 5, line 4, please replace "latch circuit LI" with --latch circuit L1--

At column 5, line 44, please replace "Vb1c" with --Vblc--

At column 5, line 67, please replace "set-up up voltage" with --set-up voltage--

At column 6, line 16, please replace "of is a" with --$\varnothing f$ is a--

At column 6, line 65, please replace "data bit "I"" with --data bit "1"--

At column 7, line 64, please replace "(i.e., MC 14)" with --(i.e., MC14)--

At column 7, line 67, please replace "MC 14p" with --MC14p--

At column 8, line 10, please replace "MC 14p and MC 14i" with --MC14p and MC14i--

At column 8, line 50, please replace "WL 15" with --WL15--

At column 8, line 59, please replace "MV 14p" with --MV14p--

UNITED STATES PATENT AND TRADEMARK OFFICE
CERTIFICATE OF CORRECTION

PATENT NO. : 6,891,754 B2
APPLICATION NO. : 10/927716
DATED : May 10, 2005
INVENTOR(S) : Jeong et al.

It is certified that error appears in the above-identified patent and that said Letters Patent is hereby corrected as shown below:

At column 8, line 63, please replace "MCI 4p" with --MC14p--

At column 9, line 3, please replace "MC 14" with --MC14--

At column 9, line 6, please replace "MC 14i" with --MC14i--

At column 9, line 26, please replace "bid ines" with --bit lines--

Signed and Sealed this

Fourteenth Day of November, 2006

JON W. DUDAS
*Director of the United States Patent and Trademark Office*